US009815981B2

(12) United States Patent
Aepli

(10) Patent No.: US 9,815,981 B2
(45) Date of Patent: Nov. 14, 2017

(54) PLASTIC MOULDING COMPOUND AND USE THEREOF

(71) Applicant: EMS—PATENT AG, Domat/Ems (CH)

(72) Inventor: Etienne Aepli, Domat/Ems (CH)

(73) Assignee: EMS-PATENT AG, Domat/Ems (CH)

( * ) Notice: Subject to any disclaimer, the term of this patent is extended or adjusted under 35 U.S.C. 154(b) by 131 days.

(21) Appl. No.: 14/572,055

(22) Filed: Dec. 16, 2014

(65) Prior Publication Data
US 2015/0175804 A1 Jun. 25, 2015

(30) Foreign Application Priority Data

Dec. 20, 2013 (EP) .................................. 13199124

(51) Int. Cl.
C08K 3/32 (2006.01)
C08L 77/06 (2006.01)
C08K 7/14 (2006.01)
H05K 5/02 (2006.01)
C08K 3/24 (2006.01)
C08K 5/3492 (2006.01)
C08K 5/5313 (2006.01)
C08K 13/04 (2006.01)

(52) U.S. Cl.
CPC ............... C08L 77/06 (2013.01); C08K 3/24 (2013.01); C08K 3/32 (2013.01); C08K 5/34928 (2013.01); C08K 5/5313 (2013.01); C08K 7/14 (2013.01); C08K 13/04 (2013.01); H05K 5/0247 (2013.01); C08K 2003/327 (2013.01); C08K 2003/328 (2013.01); C08L 2201/02 (2013.01); C08L 2203/20 (2013.01); C08L 2205/025 (2013.01); C08L 2205/16 (2013.01); Y10T 428/1352 (2015.01)

(58) Field of Classification Search
CPC .. C08L 77/06; C08L 2201/02; C08L 2203/20; C08L 2205/025; C08L 2205/16; C08K 13/04; C08K 3/24; C08K 3/32; C08K 2003/328; C08K 2003/327; C08K 7/14; C08K 5/34928; H05K 5/0247; Y10T 428/1352
USPC .......... 428/36.9, 220, 35.7, 402, 523, 318.6, 428/333, 337, 339, 35.8, 375, 418, 423.1, 428/425.1, 425.8, 426, 437, 507, 516, 96; 524/100
See application file for complete search history.

(56) References Cited

U.S. PATENT DOCUMENTS

| 3,454,536 | A |  | 7/1969 | Shade et al. |  |
|---|---|---|---|---|---|
| 4,607,073 | A |  | 8/1986 | Sakashita et al. |  |
| 4,831,106 | A |  | 5/1989 | Kempter et al. |  |
| 6,642,288 | B1 | * | 11/2003 | Hulskotte | ........... C08K 5/34928 524/100 |
| 2006/0264542 | A1 | * | 11/2006 | Schneider | ............ C08K 5/5313 524/133 |
| 2008/0274355 | A1 | * | 11/2008 | Hewel | ................... C08G 69/265 428/402 |
| 2010/0249292 | A1 | * | 9/2010 | Saga | ........................ C08L 77/00 524/133 |
| 2010/0279111 | A1 | * | 11/2010 | Philipp | ..................... C08J 5/043 428/357 |
| 2012/0083558 | A1 | * | 4/2012 | Bayer | ..................... C08K 5/098 524/101 |
| 2012/0321829 | A1 | * | 12/2012 | Bayer | ..................... C08G 69/36 428/36.9 |
| 2013/0289178 | A1 | * | 10/2013 | Li | .......................... C08L 69/00 524/127 |
| 2014/0147682 | A1 |  | 5/2014 | Takano et al. |  |

FOREIGN PATENT DOCUMENTS

| CH | EP 2535365 A1 * 12/2012 | ............. C08G 69/36 |
|---|---|---|
| DE | 1495393 A1 4/1969 |  |
| DE | 19513940 A1 1/1996 |  |
| EP | 1 29 195 A2 12/1984 |  |
| EP | 1 29 196 A2 12/1984 |  |
| EP | 2 99 444 A2 1/1989 |  |
| EP | 0 976 774 A2 2/2000 |  |
| EP | 1 274 288 A1 1/2003 |  |
| JP | 5340513 B1 11/2013 |  |

(Continued)

OTHER PUBLICATIONS

Azom (Azom, "E-Glass Fibre," 2001, p. 1-3, http://www.azom.com/article.aspx?ArticleID=764, accessed Mar. 25, 2016).*

(Continued)

Primary Examiner — James Yager
Assistant Examiner — Kevin Ortman, Jr.
(74) Attorney, Agent, or Firm — Sughrue Mion, PLLC

(57) ABSTRACT

Thermoplastic, flame-retarded plastic molding compounds with improved mechanical properties, in particular for LDS applications, are described. The thermoplastic molding compound consists of:

(A) 21-81.9 wt. % thermoplastic material, consisting of (A1) 55-100 wt. % polyamide, containing at least 50 wt. % partly aromatic, partly crystalline polyamide;

(A2) 0-45 wt. % non-polyamide based thermoplastic material, wherein (A1) and (A2) add up to 100 wt. % component (A);

(B) 10-70 wt. % glass fibers;

(C) 0.1-10 wt. % LDS additive or a mixture of LDS additives;

(D) 8-18 wt. % halogen-free flame retardant;

(E) 0-40 wt. % particulate filler, different from (C);

(F) 0-2 wt. % other further additives;

wherein the sum of (A)-(F) makes up 100 wt. %.

30 Claims, No Drawings

(56) References Cited

FOREIGN PATENT DOCUMENTS

| | | |
|---|---|---|
| WO | 00/35259 A2 | 6/2000 |
| WO | 2006/042830 A1 | 4/2006 |
| WO | 2009/141799 A1 | 11/2009 |
| WO | 2011/050934 A2 | 5/2011 |
| WO | 2012/056416 A1 | 5/2012 |
| WO | 2013/076314 A1 | 5/2013 |
| WO | 2013177850 A1 | 12/2013 |

OTHER PUBLICATIONS

European Search Report of EP 13199124.2 dated May 28, 2014.

* cited by examiner

PLASTIC MOULDING COMPOUND AND USE THEREOF

TECHNICAL FIELD

The present invention relates to thermoplastic, flame-retarded moulding compounds with improved mechanical properties. Apart from glass fibres, the moulding compounds contain a flame retardant and an LDS additive. After partial irradiation, moulded articles made therefrom are specifically metallizable. The moulding compounds according to the invention are used in particular for the production of injection-moulded interconnect devices.

PRIOR ART

Compared to previous interconnect devices, interconnect devices made of thermoplastic materials have the advantage of improved design flexibility, good environmental compatibility and potential for rationalization of the production process for the end product. The integration of electrical and mechanical functions in one moulded part can result in miniaturization of the assembly. In addition, new functions can be implemented and almost any shapes created.

From EP-A-1 274 288, the so-called additive laser direct structuring technique is known (Laser Direct Structuring, LDS), in which the moulded part with special material properties, e.g. based on seedable PBT, produced in a standard injection moulding process is structured by a laser. As a result, those regions which are later to bear the conducting tracks are seeded with metal atoms, on which a metal layer subsequently grows in chemically reducing metallization baths. The metal seeds are formed by decomposition of very finely divided metal compounds contained in the substrate material. Non-irradiated plastic areas remain unchanged in the metallization bath.

WO-A-2013/076314 describes thermoplastic moulding compounds directly structurable with a laser, which contain a mixed metal oxide based on tin and a further metal from a defined group as LDS additive and on the basis of unreinforced moulding compounds of polycarbonate or polycarbonate-ABS mixtures demonstrates that these moulding compounds have good whiteness and that the metallization can be improved with increasing antimony oxide content.

WO-A-2012/056416 indicates that with unreinforced and non-flame-retarded polycarbonate/ABS blends the addition of titanium dioxide can result in moulding compounds with good whiteness irrespective of the type of LDS additive used.

WO2009/141799 discloses directly laser-structurable moulding compounds, which as well as flame retardancy provide substantial retention of the thermomechanical properties, such as for example thermal distortion resistance. As the examples based on unreinforced polycarbonate/ABS mixtures and organic phosphates show, the moulding compounds attain the flame retardant classification V0 with 0.8 and 1.6 mm thick test pieces and the HDT values of all samples lie markedly below 100° C.

From US 2013/0289178, flame-retarded LDS moulding compounds based on polycarbonate and optionally ABS which under certain conditions attain V0 classification are known.

DESCRIPTION OF THE INVENTION

On that basis, the purpose of the present invention was to provide thermoplastic material moulding compounds suitable for the MID (Moulded Interconnect Devices) technology, in particular polyamide moulding compounds, and in particular those which as well as glass fibres also contain flame retardants and LDS additives, with which moulded articles with good mechanical properties, in particular with high rigidity, high tear resistance and good impact resistance which have a secure flame retardant classification V0 and which can be reliably soldered blister-free can be produced. In addition, the moulded articles should be readily metallizable after laser irradiation and the conducting strips should have good adhesion to the polymer substrate.

The thermal and mechanical properties and the fields of use of these interconnect devices associated therewith are primarily determined by the thermoplastic moulding compound on which they are based. Polyamides are widely used nowadays as structural elements for the indoor and outdoor sectors, which is essentially attributable to their outstanding (thermo-) mechanical properties, even under different climatic conditions.

An improvement in the mechanical properties such as strength and stiffness can in particular be obtained by the addition of fibrous reinforcing materials, e.g. glass fibres or carbon fibres, In many cases, as well as the glass fibres, particulate fillers are also used, for example in order to colour the moulding compounds by means of inorganic pigments or to effect other specific modifications of properties.

However, through the addition of particulate fillers, such as for example also the LDS additives or certain flame retardants, to the glass fibre-reinforced moulding compounds, the mechanical properties are as a rule markedly impaired, and in particular the tear resistance, elongation at break and impact resistance are normally considerably reduced. Moreover, the surface quality, in particular the gloss, is impaired.

Through the specific composition of the moulding compounds according to the invention, in spite of the combination of fibrous and particulate fillers, it is unexpectedly achieved that moulded articles produced from these moulding compounds in addition to other favourable properties display good mechanical properties and high surface quality, can be reliably soldered in the reflow soldering process and attain the flame retardant classification V0 according to UL94.

Specifically, the invention relates to a flame-retarded moulding compound, in particular with high rigidity, tear resistance and high impact resistance, according to claim 1, in particular consisting of:
(A) 21-81.9 wt. % thermoplastic material, consisting of the components (A1) and (A2), namely:
  (A1) 55-100 wt. % polyamide, containing at least 50 wt. % partly aromatic, partly crystalline polyamide;
  (A2) 0-45 wt. % non-polyamide based thermoplastic material,
  wherein (A1) and (A2) add up to 100 wt. % component (A);
(B) 10-70 wt. % glass fibres
(C) 0.1-10 wt. % LDS additive or a mixture of LDS additives, wherein preferably at least one LDS additive is selected from the following group: metal oxide, metal phosphate, preferably alkaline metal phosphate and/or metal hydroxide phosphate,
  and/or at least one LDS additive is an inorganic compound of copper and/or tin;
(D) 8-18 wt. % halogen-free flame retardant;
(E) 0-40 wt. % particulate filler, different from (C)
(F) 0-2 wt. % other further additives;
wherein the sum of (A)-(F) makes up 100 wt. %.

Also, the content of component (A) within the sum of (A)-(F) preferably lies in the range from 25-75.5 wt. %, preferably in the range from 30-71 wt. %. The component (A1) preferably consists entirely of partly aromatic, partly crystalline polyamide or a mixture thereof with amorphous polyamides or a mixture thereof with aliphatic polyamides, wherein the content of partly aromatic, partly crystalline polyamide in each case is at least 50 wt. %, based on 100 wt. % of component (A). Preferably the component (A1) mainly consists of partly aromatic, partly crystalline polyamide, that is preferably 55 to 100 wt. %, in particular 65-100 wt. % of component (A1), based on total of the plastic matrix (A), consists of partly aromatic, partly crystalline polyamide.

The content of component (B) preferably lies in the range from 15-60 wt. %, preferably in the range from 18-55 or 18-42 wt. % and in particular in the range from 20-35 wt. %.

The content of component (C) preferably lies in the range from 0.5-8 wt. %, preferably in the range from 1-6 wt. % and particularly preferably in the range from 0.5-3.5 wt. %.

The component (A) can consist of a partly aromatic, partly crystalline polyamide (A1), or else contain this mixed with up to 45% non-polyamide based thermoplastic material (A2).

The component (A2) can both be a non-polyamide based thermoplastic material (A2_1) and also an impact modifier (A2_2) different therefrom. Component (A2_1) here is preferably a thermoplastic material selected from the following group: polycarbonate, polyphenylene ether, polystyrene, polymethyl methacrylate, acrylonitrile-butadiene-styrene copolymer, acrylonitrile-styrene copolymer, polyolefin, polyoxymethylene, polyesters, in particular polyethylene terephthalate and polybutylene terephthalate, polysulphone (in particular of the PSU, PESU or PPSU type), polyphenylene sulphide, liquid crystalline polymers, polyether ketone, polyether ether ketone, polyimide, polyamide imide, polyester imide, polyurethane (in particular of the TPU or PUR type), polysiloxane, polyacrylate, polymethacrylate and mixtures or copolymers based on such systems. Particularly preferably, component A2_1 is a polyphenylene ether which is produced by oxidative coupling according to usual methods from phenols disubstituted with alkyl groups in the ortho position (see U.S. Pat. No. 3,661,848, U.S. Pat. No. 3,378,505, U.S. Pat. No. 3,306,874, U.S. Pat. No. 3,306,875 and U.S. Pat. No. 3,639,656). For their production, catalysts based on heavy metals such as copper, manganese or cobalt in combination with other substances such as secondary amines, tertiary amines, halogens or combinations thereof are normally used. Suitable polyphenylene ethers are for example poly(2,6-diethyl-1,4-phenylene) ether, poly(2-methyl-6-ethyl-1,4-phenylene) ether, poly(2-methyl-6-propyl-1,4-phenylene) ether, poly(2,6-dipropyl-1,4-phenylene) ether, poly(2-ethyl-6-propyl-1,4-phenylene) ether or copolymers, such as those which contain 2,3,6-trimethylphenol, and also mixtures of the said polyphenylene ethers.

Poly(2,6-dimethyl-1,4-phenylene) ether, optionally in combination with 2,3,6-trimethylphenol units, is preferred. The polyphenylene ethers can be used in the form of homopolymers, copolymers, graft copolymers, block copolymers or ionomers.

Suitable polyphenylene ethers generally have an intrinsic viscosity in the range from 0.1 to 0.6 dl/g, measured in chloroform at 25° C. This corresponds to a molecular weight $M_n$ (number average) of 3,000 to 40,000 and a weight average molecular weight $M_w$ of 5,000 to 80,000. It is possible to use a combination of a high viscosity and a low viscosity polyphenylene ether. The ratio of the two polyphenylene ethers of different viscosities depends on the viscosities and the desired physical properties. The mixtures with the polyamide (A1) according to the invention preferably include 15 to 40 wt. % polyphenylene ether. For better compatibility, compatibilizers in the form of polyfunctional compounds which interact with the polyphenylene ether, the polyamide or with both are used. The interaction can be chemical (e.g. by grafting) and/or physical (e.g. by influencing the surface properties of the disperse phase).

Preferably the component (A2) has constituents with acid anhydride groups which are introduced by thermal or radical reaction of the main chain polymer with an unsaturated dicarboxylic acid anhydride, an unsaturated dicarboxylic acid or an unsaturated dicarboxylic acid monoalkyl ester in a concentration which suffices for good linkage to the polyamide, wherein reagents for this selected from the following group are preferably used: maleic acid, maleic anhydride, maleic acid monobutyl ester, fumaric acid, aconitic acid and/or itaconic anhydride.

Preferably 0.1 to 4.0 wt. % of an unsaturated anhydride are grafted onto the impact resistant component as a component of (A2) or the unsaturated dicarboxylic acid anhydride or precursor thereof is grafted on together with a further unsaturated monomer. Generally the degree of grafting is preferably in a range from 0.1-1.0%, particularly preferably in a range from 0.3-0.8%. Particularly preferably, maleic anhydride-grafted polyphenylene ethers are used.

Such systems A2_1 can also more preferably be used in combination with the impact modifiers A2_2 stated below, a preferred embodiment of component A2.

In a further embodiment, the moulding compound according to the invention contains as component (A2_2) up to 45 wt. % of one or more impact modifiers (IM). If the components A2_1 and A2_2 are used together, the ratio A2_1:A2_2 is at least 1:1, preferably 1.2:1, particularly preferably 1.5:1 and thus lies in the range from 1:1 to 1:10, preferably in the range from 1.2:1 to 1:10, particularly preferably in the range from 1.5:1 to 1:8.

An IM concentration in the range between 5 and 45 wt. %, in particular from 5-30 wt. %, is preferable. The impact modifier can be a natural rubber, polybutadiene, polyisoprene, polyisobutylene, a mixed polymer of butadiene and/or isoprene with styrene or styrene derivatives and other comonomers, a hydrogenated mixed polymer and or a mixed polymer which has been formed by grafting or copolymerization with acid anhydrides, (meth)acrylic acid and esters thereof. The impact modifier (A2_2) can also be a graft rubber with a crosslinked elastomer core which consists of butadiene, isoprene or alkyl acrylates and has a graft envelope of polystyrene, a nonpolar or polar olefin homo- and copolymer such as ethylene-propylene, ethylene-propylene-diene and ethylene-octene or ethylene-vinyl acetate rubber or a nonpolar or polar olefin homo- and copolymer which has been formed by grafting or copolymerization with acid anhydrides, (meth)acrylic acid and esters thereof. The impact modifier (A2_2) can also be a carboxylic acid-functionalized copolymer such as poly-(ethene-co-(meth) acrylic acid) or poly(ethene-co-1-olefin-co-(meth)acrylic acid), wherein the 1-olefin can be an alkene or an unsaturated (meth)acrylic acid ester with more than 4 atoms, including copolymers in which the acid groups are partly neutralized with metal ions.

Preferable impact modifiers of the component (A2_2) based on styrene monomers (styrene and styrene derivatives) and other vinyl aromatic monomers are block copolymers made up of alkenyl aromatic compounds and a conjugated diene, and hydrogenated block copolymers of an alkenyl aromatic compound and conjugated dienes or combinations of these IM types. The block copolymer contains at least one block derived from an alkenyl aromatic compound (A) and at least one block derived from a conjugated diene (B). In the hydrogenated block copolymers, the content of aliphatically unsaturated carbon-carbon double bonds has been reduced by hydrogenation. As block copolymers, two-, three-, four- and poly-block copolymers with a linear structure are suitable. However, branched and star-shaped structures are also usable. Branched block copolymers are obtained in a known manner, e.g. by graft reactions of polymeric "side-branches" onto a polymer main chain. As alkenyl aromatic monomers, as well as or mixed with styrene, vinyl aromatic monomers which are substituted with C1-20 hydrocarbon residues or halogen atoms on the aromatic ring and/or on the C=C double bond can also be used.

Examples of alkenyl aromatic monomers are styrene, p-methylstyrene, α-methylstyrene, ethylstyrene, tert.-butylstyrene, vinyltoluene, 1,2-diphenylethylene, 1,1-diphenylethylene, vinylxylenes, vinyltoluenes, vinylnaphthalenes, divinylbenzenes, bromostyrenes, chlorostyrenes, and combinations thereof. Styrene, p-methylstyrene, alpha-methylstyrene and vinylnaphthalene are preferred.

As diene monomers e.g. 1,3-butadiene, 2-methyl-1,3-butadiene, 2,3-dimethyl-1,3-butadiene, 1,3-pentadiene, 1,3-hexadiene, isoprene, chloroprene and piperylene are possible. 1,3-Butadiene and isoprene are preferable, in particular 1,3-butadiene (hereinafter referred to in brief as butadiene).

Preferably styrene is used as the alkenyl aromatic monomer and butadiene as the diene monomer, i.e. the styrene-butadiene block copolymer is preferable. As a rule, the block copolymers are produced in a manner in itself known by anionic polymerization.

Furthermore, in addition to the styrene and diene monomers, further comonomers can also be used. The content of the comonomers is preferably 0 to 50, particularly preferably 0 to 30 and in particular 0 to 15 wt. %, based on the total quantity of the monomers used. Suitable comonomers are for example acrylates, in particular C1-12 alkyl acrylates such as n-butyl acrylate or 2-ethylhexyl acrylate, and the corresponding methacrylates, in particular C1-12 alkyl methacrylates such as methyl methacrylate (MMA). Further possible comonomers are (meth)acrylonitrile, glycidyl (meth)acrylate, vinyl methyl ether, diallyl and divinyl ether bifunctional alcohols, divinylbenzene and vinyl acetate.

In addition to the conjugated diene, the hydrogenated block copolymers of the component (A2) optionally also contain proportions of lower hydrocarbons such as for example ethylene, propylene, 1-butene, dicyclopentadiene or non-conjugated dienes. In the hydrogenated block copolymers, the content of the non-reduced aliphatic unsaturated bonds which result from the block B is less than 50%, preferably less than 25%, in particular less than 10%. The aromatic contents from block A are at most reduced to 25%. The hydrogenated block copolymers styrene-(ethylene-butylene) two-block and styrene-(ethylene-butylene)-styrene three-block copolymers are obtained by hydrogenation of styrene-butadiene and styrene-butadiene-styrene copolymers. The block copolymers preferably consist of 20 to 90 wt. % block A, in particular of 50 to 85 wt. % block A. The diene can be incorporated into the block B in 1,2 or in 1,4 orientations.

Examples of non-hydrogenated block copolymers are polystyrene-polybutadiene, polystyrene-poly(ethylene-propylene), polystyrene-polyisoprene, poly(α-methylstyrene)-polybutadiene, polystyrene-polybutadiene-polystyrene (SBS), polystyrene-poly(ethylene-propylene)-polystyrene, polystyrene-polyisoprene-polystyrene and poly(α-methylstyrene-polybutadiene-poly(α-methylstyrene), and also combinations thereof.

Suitable non-hydrogenated block copolymers which are commercially available are various products with the brand names SOLPRENE® (Phillips), KRATON® (Shell), VECTOR® (Dexco) and SEPTON® (Kuraray).

According to a further preferred embodiment, the moulding compounds according to the invention are characterized in that the component (A2_2) contains a polyolefin homopolymer or an ethylene-α-olefin copolymer, particularly preferably an EP and/or EPDM elastomer (ethylene-propylene rubber and ethylene-propylene-diene rubber respectively). Thus for example it can be an elastomer which is based on an ethylene-C3-12 α-olefin copolymer with 20 to 96, preferably 25 to 85 wt. % ethylene, wherein the C3-12 α-olefin is particularly preferably an olefin selected from the group propene, 1-butene, 1-pentene, 1-hexene, 1-octene, 1-decene and/or 1-dodecene, and the component C is particularly preferably ethylene-propylene rubber and/or LLDPE and/or VLDPE.

Alternatively or in addition (for example in a mixture) (A2) can contain a terpolymer based on ethylene-C3-12 α-olefin with an unconjugated diene, wherein this preferably contains 25 to 85 wt. % ethylene and up to at most in the region of 10 wt. % of an unconjugated diene, wherein particularly preferably the C3-12 α-olefin is an olefin selected from the group propene, 1-butene, 1-pentene, 1-hexene, 1-octene, 1-decene and/or 1-dodecene, and/or wherein the unconjugated diene is preferably selected from the group bicyclo(2.2.1) heptadiene, 1,4-hexadiene, dicyclopentadiene and/or in particular 5-ethylidenenorbornene.

Also possible as a constituent for the component (A2_2) are ethylene-acrylate copolymers. Further possible forms as constituents for the component (A2_2) are the ethylene-butylene copolymers or mixtures (blends) which contain such systems.

Preferably, the component (A2_2) has constituents with acid anhydride groups which are introduced by thermal or radical reaction of the main chain polymer with an unsaturated dicarboxylic acid anhydride, an unsaturated dicarboxylic acid or an unsaturated dicarboxylic acid monoalkyl ester in a concentration which suffices for good linkage to the polyamide, wherein reagents for this selected from the following group are preferably used: maleic acid, maleic anhydride, maleic acid monobutyl ester, fumaric acid, aconitic acid and/or itaconic anhydride.

Preferably 0.1 to 4.0 wt. % of an unsaturated anhydride are grafted onto the impact resistant component as a constituent of (A2_2) or the unsaturated dicarboxylic acid anhydride or the precursor thereof is grafted on together with a further unsaturated monomer. Generally the degree of grafting is preferably in a range from 0.1-1.0%, particularly preferably in a range from 0.3-0.7%. Also possible as a constituent of the component (A2_2) is a mixture of an ethylene-propylene copolymer and an ethylene-butylene copolymer, this with a maleic anhydride degree of grafting (MAH degree of grafting) in the range from 0.3-0.7%. The aforesaid possible systems for the component can also be used in mixtures.

Furthermore, the component (A2_2) can have constituents which have functional groups such as for example carboxylic acid, ester, epoxy, oxazoline, carbodiimide, isocyanate, silanol and carboxylate groups, or contain combinations of two or more of the said functional groups. Monomers which bear these functional groups can be bound to the elastomeric polyolefin by co-polymerization or grafting. In addition, the IM based on the olefin polymers can also be modified by grafting with an unsaturated silane compound, e.g. vinyltrimethoxysilane, vinyltriethoxysilane, vinyltriacetosilane, methacryloxypropyl-trimethoxysilane or propenyltrimethoxysilane.

The elastomeric polyolefins are random, alternating or segmented copolymers with linear, branched or core-shell structure and contain functional groups which can react with the terminal groups of the polyamides, so that adequate compatibility between polyamide and IM results.

The IMs used as component (A2_2) thus include homopolymers or copolymers of olefins such as for example ethylene, propylene, butene-1, or copolymers of olefins and copolymerizable monomers such as vinyl acetate, (meth) acrylic acid esters and methylhexadiene.

The following olefin polymers are particularly preferable: low, medium and high density polyethylene, polypropylene, polybutadiene, poly-4-methylpentene, ethylene-propylene block or random copolymers, ethylene-methylhexadiene copolymers, propylene-methylhexadiene copolymers, ethylene-propylene-butene copolymers, ethylene-propylene-hexene copolymers, ethylene-propylene-methylhexadiene copolymers, poly(ethylene-vinyl acetate) (EVA), poly(ethylene-ethyl acrylate) (EEA), ethylene-octene copolymer, ethylene-butene copolymer, ethylene-hexene copolymer, ethylene-propylene-diene terpolymers and combinations of the said polymers. In particular it is preferable if these olefin polymers are functionalized with acid anhydride groups.

Examples of commercially available impact modifiers which can be used in the context of the constituents of the component (A2_2) are: TAFMER MC201, TAFMER MH5010, TAFMER MH7010 or TAFMER MH7020 from Mitsui Chemicals; EXXELOR VA1801, EXXELOR VA1803, EXXELOR VA1810 or EXXELOR MDEX 94-11, Exxon Mobile Chemical; FUSABOND MN493D or FUSABOND A EB560D; and ELVALOY, DuPont. Also preferable in the context of component (A2) is an ionomer in which the polymer-bound carboxyl groups are wholly or partly bound together by metal ions.

Particularly preferable are mixed polymers of butadiene with styrene functionalized by grafting with maleic anhydride, nonpolar or polar olefin homo- and copolymers, which were formed by grafting with maleic anhydride, and carboxylic acid-functionalized copolymers such as poly(ethene-co-(meth)acrylic acid) or poly(ethene-co-1-olefin-co-(meth)acrylic acid), in which the acid groups are partly neutralized with metal ions.

The moulding compound according to the invention preferably consists of 21 to 81 wt. % of a thermoplastic material mixture (A) consisting of polyamide (A1) and a non-polyamide based thermoplastic material (A2), wherein the concentration of (A2) constitutes at most 45 wt. % based on the mixture A. The component A1 here preferably consists of 50-100 wt. % partly aromatic, partly crystalline polyamide. In particular, component (A1) is a mixture of partly aromatic, partly crystalline polyamides (component A1_1) and amorphous, partly aromatic polyamides (component A1_2) and/or aliphatic polyamides (A1_3), wherein the content of partly aromatic partly crystalline polyamides A1_1 is at least 50 wt. %, preferably at least 60 wt. % and particularly preferably at least 65 wt. %. The concentration of component (A1_2) or (A1_3) or the sum of (A1_2) and (A1_3) here lies in the range from 5-50 wt. %, preferably in the range from 10-40 wt. % and particularly preferably in the range from 10-35 wt. %.

The polyamides A1_1, A1_2 or A1_3 preferably have a solution viscosity $\eta_{rel}$, measured in m-cresol (0.5 wt. %, 20° C.), in the range from 1.4 to 3.0, preferably in the range from 1.5 to 2.7, in particular in the range from 1.5 to 2.4.

The component (A1_1) is partly crystalline, partly aromatic polyamides which preferably have a glass transition temperature in the range from 90 to 140° C., preferably in the range from 110 to 140° C. and in particular in the range from 115 to 135° C. The melting point of the polyamide (A1_1) lies in the range from 255 to 330° C., preferably in the range from 270 to 325° C. and in particular in the range from 280 to 320° C. The partly crystalline, partly aromatic polyamides of the component (A1) preferably have melting enthalpies determined by DSC (ISO standard 11357-11-2) in the range from 25 to 80 J/g, preferably in the range from 30 to 70 J/g.

Preferable partly aromatic partly crystalline polyamides here are produced from
a) 30 to 100 mol. %, in particular 50 to 100 mol. % terephthalic acid and/or naphthalene-dicarboxylic acid and 0 to 70 mol. %, in particular 0 to 50 mol. %, of at least one aliphatic dicarboxylic acid with 6 to 12 carbon atoms, and/or 0 to 70 mol. %, in particular 0 to 50 mol. %, of at least one cycloaliphatic dicarboxylic acid with 8 to 20 carbon atoms, and/or 0 to 50 mol. % isophthalic acid, based on the total quantity of the dicarboxylic acids,
b) 80 to 100 mol. % of at least one aliphatic diamine with 4-18 carbon atoms, preferably with 6 to 12 carbon atoms, and 0 to 20 mol. % of at least one cycloaliphatic diamine, preferably with 6 to 20 carbon atoms, such as for example PACM, MACM and IPDA and/or 0 to 20 mol. % of at least one araliphatic diamine, such as for example MXDA and PXDA, based on the total quantity of the diamine, and optionally
c) aminocarboxylic acids and/or lactams each with 6 to 12 carbon atoms.

According to a preferred embodiment, the partly aromatic polyamide of the component (A1_1) is based on at least 55 mol. %, in particular on at least 65 mol. % terephthalic acid and at least 80 mol. %, preferably at least 90 mol. %, in particular at least 95 mol. % aliphatic diamines with 4 to 18 carbon atoms, preferably with 6-12 carbon atoms, and optionally further aliphatic, cycloaliphatic and aromatic dicarboxylic acids and lactams and/or aminocarboxylic acids. As further aromatic dicarboxylic acids, as well as the terephthalic acid, isophthalic acid and naphthalenedicarboxylic acid can be used. Suitable aliphatic and cycloaliphatic dicarboxylic acids which can be used as well as terephthalic acid have 6 to 36 carbon atoms and are used in a proportion of at most 70 mol. %, in particular in a proportion of at most 50 mol. %, based on the total quantity of the dicarboxylic acids.

Also, it is preferable that the said aromatic dicarboxylic acids of the partly aromatic polyamides of the component (A1_1) are selected from the group: terephthalic acid, isophthalic acid, and mixtures thereof.

According to a further preferred embodiment, the said e.g. aliphatic dicarboxylic acids of the partly aromatic polyamide of the component (A1_1) which can be used as well as terephthalic acid are selected from the group adipic acid, suberic acid, azelaic acid, sebacic acid, undecanedioic acid, dodecanedioic acid, brassylic acid, tetradecanedioic acid, pentadecanedioic acid, hexadecanedioic acid, octadecanedioic acid and dimer fatty acid (C36). Particularly preferred are adipic acid, sebacic acid and dodecanedioic acid. Accordingly, dicarboxylic acids which are preferably used as well as terephthalic acid are: isophthalic acid, adipic acid, sebacic acid and dodecanedioic acid or a mixture of such dicarboxylic acids. Polyamides A1_1 which are based exclusively on terephthalic acid as dicarboxylic acid are particularly preferable.

According to a further preferred embodiment, the said aliphatic diamines of the partly aromatic polyamide of the component (A1_1) are selected from the group 1,4-butanediamine, 1,5-pentanediamine, 1,6-hexanediamine, 1,7-heptanediamine, 1,8-octanediamine, 1,9-nonanediamine, methyl-1,8-octanediamine, 1,10-decanediamine, 1,11-undecanediamine, 1,12-dodecanediamine, or a mixture of such diamines, wherein 1,6-hexanediamine, 1,10-decanediamine, 1,12-dodecanediamine, or a mixture of such diamines is preferable, wherein 1,6-hexanediamine and 1,10-decanediamine are particularly preferable. As well as the aliphatic diamines, cycloaliphatic and/or araliphatic diamines can be used in a concentration of 0 to 20 mol. %, based on the total quantity of diamines. Particularly preferably, the high-melting polyamides are formed from the following components:

a) (A1_1a) dicarboxylic acids: 50-100 mol. % aromatic terephthalic acid and/or naphthalene-dicarboxylic acid, based on the total content of dicarboxylic acids present, 0-50 mol. % of an aliphatic dicarboxylic acid, preferably with 6 to 12 carbon atoms, and/or a cycloaliphatic dicarboxylic acid preferably with 8 to 20 carbon atoms, and/or isophthalic acid;

b) (A1_1b) diamines: 80-100 mol. % of at least one aliphatic diamine with 4-18 carbon atoms, preferably with 6 to 12 carbon atoms, based on the total content of diamines present, 0-20 mol. % cycloaliphatic diamines, preferably with 6 to 20 carbon atoms, such as for example PACM, MACM, IP-DA and/or araliphatic diamines, such as for example MXDA and PXDA, wherein the percentage molar content of dicarboxylic acids in the high-melting polyamides amounts to 100% and the percentage molar content of diamines amounts to 100%, and optionally from:

c) (A1_1c) aminocarboxylic acids and/or lactams, containing lactams preferably with 6 to 12 carbon atoms, and/or aminocarboxylic acids preferably with 6 to 12 carbon atoms. While the components (A1_1a) and (A1_1b) are used essentially in an equimolar manner, the concentration of (A1_1c) is preferably at most 20 wt. %, preferably at most 15 wt. %, in particular at most 12 wt. %, each based on the sum of (A1_1a) to (A1_1c).

In addition to the components (A1_1a) and (A1_1b) used essentially in an equimolar manner, dicarboxylic acids (A1_1a) or diamines (A1_1b) can be used to regulate the molecular mass or to compensate for monomer losses during the polymer production, so that overall the concentration of one component (A1_1a) or (A1_1b) can predominate. Suitable cycloaliphatic dicarboxylic acids are cis and/or trans cyclohexane-1,4-dicarboxylic acid and/or cis and/or trans cyclohexane-1,3-dicarboxylic acid (CHDA).

The aforesaid aliphatic diamines as a rule used can be replaced by other diamines in a lesser quantity of not more than 20 mol. %, preferably not more than 15 mol. % and in particular not more than 10 mol. %, based on the total quantity of the diamines. As cycloaliphatic diamines, for example cyclohexanediamine, 1,3-bis-(aminomethyl)-cyclohexane (BAC), isophoronediamine, norbornanedimethylamine, 4,4'-diaminodicyclohexylmethane (PACM), 2,2-(4, 4'-diaminodicyclohexyl)propane (PACP) and 3,3'-dimethyl-4,4'-diamino-dicyclohexylmethane (MACM) can be used.

As araliphatic diamines, m-xylylenediamine (MXDA) and p-xylylenediamine (PXDA) may be mentioned.

In addition to the dicarboxylic acids and diamines described, lactams and/or aminocarboxylic acids can also be used as polyamide-forming components (component (A1c)). Suitable compounds are for example caprolactam (CL), α,ω-aminocaproic acid, α,ω-aminononanoic acid, α,ω-aminoundecanoic acid (AUA), laurolactam (LL) and α,ω-aminododecanoic acid (ADA). The concentration of the aminocarboxylic acids and/or lactams used together with the components (A1a) and (A1b) is at most 20 wt. %, preferably at most 15 wt. % and particularly preferably at most 12 wt. %, based on the sum of the components (A1a) to (A1c). Especially preferable are lactams or α,ω-amino acids with 4, 6, 7, 8, 11 or 12 C atoms. These are the lactams pyrrolidin-2-one (4 C atoms), ε-caprolactam (6 C atoms), oenantholactam (7 C atoms), caprylic lactam (8 C atoms), laurolactam (12 C atoms) and the α,ω-amino acids 1,4-aminobutanoic acid, 1,6-aminohexanoic acid, 1,7-aminoheptanoic acid, 1,8-aminooctanoic acid, 1,11-aminoundecanoic acid and 1,12-aminododecanoic acid. In a particularly preferred embodiment, component A1_1 is free from caprolactam or aminocaproic acid.

To regulate the molecular mass, the relative viscosity or the flowability or the MVR, regulators in the form of monocarboxylic acids or monoamines can be added to the batch and/or to the precondensate (before the postcondensation). Aliphatic, cycloaliphatic or aromatic monocarboxylic acids or monoamines suitable as regulators are acetic acid, propionic acid, butyric acid, valeric acid, caproic acid, lauric acid, stearic acid, 2-ethylhexanoic acid, cyclohexanoic acid, benzoic acid, 3-(3,5-di-tert-butyl-4-hydroxyphenyl)propanoic acid, 3,5-di-tert-butyl-4-hydroxybenzoic acid, 3-(3-tert-butyl-4-hydroxy-5-methylphenyl)propanoic acid, 2-(3,5-di-tert-butyl-4-hydroxybenzylthio)acetic acid, 3,3-bis(3-tert-butyl-4-hydroxy-phenyl)butanoic acid, butylamine, pentylamine, hexylamine, 2-ethylhexylamine, n-octylamine, n-dodecylamine, n-tetradecylamine, n-hexadecylamine, stearylamine, cyclohexylamine, 3-(cyclohexylamino)propylamine, methylcyclohexylamine, dimethylcyclohexylamine, benzylamine, 2-phenylethylamine, 2,2,6,6-tetramethylpiperidin-4-amine, 1,2,2,6,6-pentamethylpiperidin-4-amine, 4-amino-2,6-di-tert-butylphenol inter alia. The regulators can be used singly or in combination. Other monofunctional compounds which can react with an amino or acid group, such as anhydrides, isocyanates, acid halides or esters, can also be used as regulators. The normal quantity of the regulators used lies between 10 and 200 mmol per kg polymer.

The partly aromatic copolyamides (A1_1) can be produced by methods in themselves known. Suitable methods have been described in various places, and some of the possible methods discussed in the patent literature will be stated below, and the disclosure content of the documents named below with regard to the method for production of the polyamide of the component (A_1) of the present invention is expressly included in the disclosure content of the present application: DE-A-195 13 940, EP-A-0 976 774, EP-A-0 129 195, EP-A-0 129 196, EP-A-0 299 444, U.S. Pat. No. 4,831,106, U.S. Pat. No. 4,607,073, DE-A-14 95 393 and U.S. Pat. No. 3,454,536.

Specific representatives of the polyamides (A1_1) according to the invention are: PA 4T/4I, PA 4T/6I, PA 5T/5I, PA 6T/6, PA 6T/6I, PA 6T/6I/6, PA 6T/66, PA 6T/610, 6T/612, 6T/10T, PA 6T/10I, PA 9T, PA 10T, PA 12T, PA 10T/10I, PA10T/106, PA10T/12, PA10T/11, PA 6T/9T, PA 6T/12T, PA 6T/10T/6I, PA 6T/6I/6, PA 6T/6I/12 and mixtures thereof, and particularly preferably, the partly aromatic polyamide of the component (A_1) is selected from the group: PA 6T/6I, PA 6T/10T, PA 6T/10T/6I, and mixtures thereof. Polyamides (A1_1) which contain 6T units, in particular at least 10 wt. % of 6T units, are preferable.

Hence, according to the invention the following partly aromatic copolyamides are particularly preferable as high-melting polyamides (A1_1):
- partly crystalline polyamide 6T/6I with 55 to 75 mol. % hexamethylene terephthalamide units and 25 to 45 mol. % hexamethylene isophthalamide units;
- partly crystalline polyamide 6T/6I with 62 to 73 mol. % hexamethylene terephthalamide units and 25 to 38 mol. % hexamethylene isophthalamide units;
- partly crystalline polyamide 6T/6I with 70 mol. % hexamethylene terephthalamide units and 30 mol. % hexamethylene isophthalamide units;
- partly crystalline polyamide, produced from at least 50 mol. % terephthalic acid and at most 50 mol. % isophthalic acid, in particular from 100 mol. % terephthalic acid, and a mixture of at least two diamines, selected from the group hexamethylendiamine, nonanediamine, methyloctanediamine and decanediamine;
- partly crystalline polyamide, produced from 70-100 mol. % terephthalic acid and 0-30 mol. % isophthalic acid and a mixture of hexamethylendiamine and dodecanediamine;
- partly crystalline polyamide, produced from at least 50 mol. % terephthalic acid and at most 50 mol. % dodecanedioic acid and a mixture of at least two diamines selected from the group hexamethylendiamine, nonanediamine, methyloctanediamine and decanediamine;
- partly crystalline polyamide 6T/10T with 10 to 60 mol. %, preferably 10 to 40 mol. % hexamethylene terephthalamide (6T) and 40 to 90 mol. %, preferably 60 to 90 mol. % decamethylene terephthalamide (10T) units;
- partly crystalline polyamide 6T/10T/6I with 50 to 90 mol. %, preferably 50-70 mol. % hexamethylene terephthalamide (6T), and 5 to 45 mol. %, preferably 10-30 mol. % hexamethylene isophthalamide (6I) units and 5 to 45 mol. %, preferably 20-40 mol. % decamethylene terephthalamide (10T) units;
- partly crystalline polyamide 6T/6I/6 with 60 to 85 mol. % hexamethylene terephthalamide (6T) and 15 to 40 mol. % hexamethylene isophthalamide-(6I) units, which additionally contains 5-15 wt. % caprolactam.

The partly aromatic, partly crystalline polyamide (A1_1) has a solution viscosity $\eta_{rel}$, (determined according to DIN EN ISO 307, 0.5 wt. % in m-cresol, 20° C.) of at most 2.6, preferably of at most 2.3, in particular of at most 2.0. Polyamides (A1) with a solution viscosity $\eta_{rel}$ in the range from 1.45 to 2.3, in particular in the range from 1.5 to 2.0 or 1.5 to 1.8 are preferable.

The polyamides according to the invention (A1_1) can be produced on normal polycondensation plants via the process sequence precondensate and postcondensation. For the polycondensation, the chain regulators described are preferably used to regulate the viscosity. In addition, the viscosity can be adjusted by the use of an excess of diamine or dicarboxylic acid.

For the polyamides (A1_2), the copolyamides 6I/6T, 10I/10T, 12/6T, MXD6/MXDI are preferable. The amorphous copolyamides 6I/6T, 10I/10T and 12/6T with a content of less than 50 mol. % 6T or 10T units are particularly preferable. PA 6I/6T and PA 10I/10T are especially preferable, with a composition range T:I from 20:80 to 45:55 being preferred. With regard to the copolyamides MXD6/MXDI, MXD6-rich compositions are preferable, in particular with a MXD6 content of greater than 80 mol. %, particularly preferably in the range from 82 to 95 mol. %. The amorphous partly aromatic polyamides (A1_2) preferably have a solution viscosity $\eta_{rel}$, measured in m-cresol (0.5 wt. %, 20° C.), in the range from 1.3 to 2.0, preferably in the range from 1.4 to 1.8, in particular in the range from 1.45 to 1.75. The melting enthalpy of the amorphous components A1_2 determined by means of DSC is at most 4 J/g, preferably less than 2 J/g, and in particular not measurable.

As aliphatic polyamides (A1_3), polyamide 46, polyamide 6, polyamide 66, polyamide 11, polyamide 12, polyamide 1212, polyamide 1010, polyamide 1012, polyamide 1112, polyamide 610, polyamide 612, polyamide 69, polyamide 810 or mixtures, blends or alloys thereof are preferable. PA66, PA 1010 and PA12 are particularly preferable. The aliphatic polyamides (A1_3) here preferably have a solution viscosity $\eta_{rel}$, measured in m-cresol (0.5 wt. %, 20° C.), in the range from 1.3 to 2.3, preferably in the range from 1.35-2.0, in particular in the range from 1.40 to 1.90.

The said polyamides (A1_3) can be produced from the following dicarboxylic acids: adipic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, octadecanedioic acid, C36-dimer fatty acid and mixtures thereof. As diamines, the following monomers are possible: 1,4-butanediamine, 1,5-pentanediamine, 2-methyl-1,5-pentanediamine, 2-butyl-2-ethyl-1,5-pentanediamine, 1,6-hexanediamine, 2,2,4-trimethylhexamethylendiamine, 2,4,4-trimethylhexamethylendiamine, 1,8-octane-diamine, 2-methyl-1,8-octanediamine, 1,9-nonanediamine, 1,10-decanediamine, 1,11-undecanediamine, 1,12-dodecanediamine, 1,13-tridecanediamine, 1,14-tetradecanediamine, 1,15-pentadecanediamine, 1,16-hexadecanediamine and 1,18-1,14-octadecandiamine.

Furthermore, the polyamides can also be made up of lactams or aminocarboxylic acids, in particular α,ω-amino acids or lactams with 6 to 12 carbon atoms, wherein for example the following selection may be mentioned: caprolactam (CL), ω-aminocaproic acid, ω-aminoheptanoic acid, ω-aminoctanoic acid, ω-aminononanoic acid, ω-aminodecanoic acid, ω-aminoundecanoic acid (AUA), laurolactam (LL) and ω-aminododecanoic acid (ADA). Caprolactam, aminocaproic acid, laurolactam and aminododecanoic acid are particularly preferable.

For a polymer mixture containing the polyamide components A1_1 and A1_2, the following compositions are preferable:
(A1_1): PA 6T/10T
(A1_2): PA 6I/6T, wherein the molar ratio lies in the range from 65:35 to 75:25 or in particular is 67:33.
(A1_1): PA 6T/10T/6I;
(A1_2): PA 6I/6T, wherein the molar ratio lies in the range from 65:35 to 75:25 or in particular is 67:33.
(A1_1): PA 6T/6I, wherein the molar ratio lies in the range from 60:40 to 75:25;
(A1_2): PA 6I/6T, wherein the molar ratio lies in the range from 65:35 to 75:25 or in particular is 67:33.
(A1_1): PA6T/10T
(A1_2): PA MXD6/MXDI, wherein in the copolyamide the molar ratio lies in the range from 70:30 to 90:10 or in particular is 88:12.

Here the content of the component (A1_1) in each case preferably lies in the range from 50 to 90 wt. %, in particular from 60 to 85 wt. % and that of component (A1_2) preferably in the range from 10 to 50 wt. %, in particular in the range from 15 to 40 wt. %, each based on component (A1).

In a particular embodiment, the following compositions are preferable for the polymer mixture (polyamide matrix):
(A1_1): 55-95 wt. % PA 6T/10T, wherein the molar ratio lies in the range from 10:90 to 40:60;
(A1_2): 5-45 wt. % PA 6I/6T, wherein the 6I content is 62-72 mol. %.

Furthermore, the moulding compounds contain 10 to 70 wt. % of the components (B) in the form of glass fibres (B), which are for example used in the form of so-called short fibres (e.g. chopped glass with a length of 0.2-20 mm) or continuous fibres (rovings). The glass fibres (B) can have different cross sections, with glass fibres with circular cross section (round fibres) and with non-circular cross section (flat fibres) being preferable.

Glass fibres with circular cross section, i.e. round glass fibres, have a diameter in the range from 5-20 µm, preferably in the range from 5-13 µm and particularly preferably in the range from 6-10 µm. They are preferably used as short glass fibres (chopped glass with a length of 0.2 to 20 mm, preferably 2-12 mm).

In the case of the flat glass fibres, i.e. glass fibres with non-circular cross section, those with a dimension ratio of the major cross-sectional axis to the minor cross-sectional axis lying perpendicular thereto of more than 2.5, preferably in the range from 2.5 to 6, in particular in the range from 3 to 5 are preferably used. These so-called flat glass fibres have an oval, elliptical, elliptical provided with constriction(s) (so-called cocoon fibres), polygonal, rectangular or almost rectangular cross section. A further characterizing feature of the flat glass fibres used consists in that the length of the major cross-sectional axis preferably lies in the range from 6 to 40 µm, in particular in the range from 15 to 30 µm and the length of the minor cross-sectional axis in the range from 3 to 20 µm, in particular in the range from 4 to 10 µm. At the same time, the flat glass fibres have as high a packing density as possible, i.e. the glass cross-sectional area to the extent of at least 70%, preferably at least 80% and particularly preferably at least 85% fills an imaginary rectangle surrounding the glass fibre cross section as exactly as possible.

For reinforcement of the moulding compounds according to the invention, mixtures of glass fibres with circular and non-circular cross section can also be used, wherein the content of flat glass fibres preferably predominates, i.e. makes up more than 50 wt. % of the total mass of the fibres.

Preferably the component (B) is selected from the group consisting of: E-glass fibres (according to ASTM D578-00 these consist of 52-62% silicon dioxide, 12-16% aluminium oxide, 16-25% calcium oxide, 0-10% borax, 0-5% magnesium oxide, 0-2% alkali metal oxides, 0-1.5% titanium dioxide and 0-0.3% iron oxide; they preferably have a density of 2.58±0.04 g/cm$^3$, a tensile E modulus of 70-75 GPa, a tensile strength of 3000-3500 MPa and an elongation at break of 4.5-4.8%), A-glass fibres (63-72% silicon dioxide, 6-10% calcium oxide, 14-16% sodium and potassium oxide, 0-6% aluminium oxide, 0-6% boron oxide, 0-4% magnesium oxide), C-glass fibres (64-68% silicon dioxide, 11-15% calcium oxide, 7-10% sodium and potassium oxide, 3-5% aluminium oxide, 4-6% boron oxide, 2-4% magnesium oxide), D-glass fibres (72-75% silicon dioxide, 0-1% calcium oxide, 0-4% sodium and potassium oxide, 0-1% aluminium oxide, 21-24% boron oxide), basalt fibres (mineral fibre with the approximate composition: 52% $SiO_2$, 17% $Al_2O_3$, 9% CaO, 5% MgO, 5% $Na_2O$, 5% iron oxide and other metal oxides), AR-glass fibres (55-75% silicon dioxide, 1-10% calcium oxide, 11-21% sodium and potassium oxide, 0-5% aluminium oxide, 0-8% boron oxide, 0-12% titanium dioxide, 1-18% zirconium oxide, 0-5% iron oxide) and mixtures thereof.

A preferable embodiment of the component (B) is high-strength glass fibres based on the ternary system silicon dioxide-aluminium oxide-magnesium oxide or on the quaternary system silicon dioxide-aluminium oxide-magnesium oxide-calcium oxide, wherein the sum of the contents of silicon dioxide, aluminium oxide and magnesium oxide is at least 78 wt. %, preferably at least 87% and particularly preferably at least 92% based on the total glass composition.

Specifically, a composition of 58-70 wt. % silicon dioxide ($SiO_2$), 15-30 wt. % aluminium oxide ($Al_2O_3$), 5-15 wt. % magnesium oxide (MgO), 0-10 wt. % calcium oxide (CaO) and 0-2 wt. % further oxides, such as for example zirconium dioxide ($ZrO_2$), boron oxide ($B_2O_3$), titanium dioxide ($TiO_2$) or lithium oxide ($Li_2O$) is preferably used. In a further embodiment, the high-strength glass fibre has a composition of 60-67 wt. % silicon dioxide ($SiO_2$), 20-28 wt. % aluminium oxide ($Al_2O_3$), 7-12 wt. % magnesium oxide (MgO), 0-9 wt. % calcium oxide (CaO) and 0-1.5 wt. % further oxides, such as for example zirconium dioxide ($ZrO_2$), boron oxide ($B_2O_3$), titanium dioxide ($TiO_2$) and lithium oxide ($Li_2O$).

It is particularly preferable if the high-strength glass fibre has the following composition: 62-66 wt. % silicon dioxide ($SiO_2$), 22-27 wt. % aluminium oxide ($Al_2O_3$), 8-12 wt. % magnesium oxide (MgO), 0-5 wt. % calcium oxide (CaO) and 0-1 wt. % further oxides, such as for example zirconium dioxide ($ZrO_2$), boron oxide ($B_2O_3$), titanium dioxide ($TiO_2$) and lithium oxide ($Li_2O$).

The high-strength glass fibre has a tensile strength of greater than or equal to 3700 MPa, preferably at least 3800 or 4000 MPa, an elongation at break of at least 4.8%, preferably at least 4.9 or 5.0%, and a tensile E modulus of greater than 75 GPa, preferably of more than 78 or 80 GPa, where these glass properties are to be determined on single fibres (pristine single filament) with a diameter of 10 µm and a length of 12.7 mm at a temperature of 23° C. and a relative atmospheric humidity of 50%. Specific examples of these high-strength glass fibres of the component (B1) are S-glass fibres from Owens Corning with 995 size, T-glass fibres from Nittobo, HiPertex from 3B, HS4-glass fibres from Sinoma Jinjing Fiberglass, R-glass fibres from Vetrotex and S-1- and S-2-glass fibres from AGY. The glass fibres (continuous fibres) used for example as roving according to the invention have a diameter (for round glass fibres) or a minor cross-sectional axis (for flat glass fibres) of 8 to 20 µm, preferably of 12 to 18 µm, wherein the cross section of the glass fibres can be round, oval, elliptical, elliptical provided with constriction(s), polygonal, rectangular or almost rectangular. Particularly preferable are so-called flat glass fibres with a ratio of the cross-sectional axes, i.e. a ratio of major to minor cross-sectional axis of 2.5 to 5. The continuous fibres can be produced from the glass types described above, and continuous fibres based on E-glass and the high-strength glass types are preferable. These continuous fibres are incorporated in the polyamide moulding compounds according to the invention by known methods for the production of long fibre-reinforced pellets, in particular by pultrusion methods, in which the continuous fibre strand (roving) is completely impregnated with the polymer melt and then cooled and chopped. The long fibre-reinforced pellets obtained in this manner, which preferably have a pellet length of 3 to 25 mm, in particular 4 to 12 mm, can be further processed into moulded articles with the usual processing methods (such as for example injection moulding and pressing).

As component (B), glass fibres of E-glass, with non-circular cross section (flat fibres) and with an axis ratio of the major cross-sectional axis to the minor cross-sectional axis of at least 2.5, and/or high-strength glass fibres with circular or non-circular cross section and a glass composition based essentially on the components silicon dioxide, aluminium oxide and magnesium oxide, wherein the content of magnesium oxide (MgO) is 5-15 wt. % and the content of calcium oxide 0-10 wt. % are preferable.

The glass fibres of component (B) as flat E-glass fibres preferably have a density of 2.54-2.62 g/cm$^3$, a tensile E modulus of 70-75 GPa, a tensile strength of 3000-3500 MPa and an elongation at break of 4.5-4.8%, where the mechanical properties were determined on single fibres with a diameter of 10 µm and a length of 12.7 mm at 23° C. and a relative atmospheric humidity of 50%.

The glass fibres according to the invention can be provided with a size containing a coupling agent based on an amino- or epoxysilane compound suitable for thermoplastics, in particular for polyamides Preferably the content of component (C) lies in the range from 0.5-8 wt. %, preferably in the range from 1-6 wt. % and particularly preferably in the range from 0.5-4.5 wt. %.

The component (C) is preferably an LDS additive with an absorption coefficient for UV, VIS or IR radiation other than zero, which under the action of electromagnetic radiation, preferably as laser radiation, forms metal seeds, which in a chemical metalization process facilitate and/or enable and/or improve the deposition of metal layers for the creation of conductor tracks at the irradiated sites on the moulded article surface, wherein the LDS additive preferably has an absorbance in the visible and infrared radiation region with an absorption coefficient of at least 0.05, preferably at least 0.1 and in particular at least 0.2, and/or that an absorber is provided which transfers the radiation energy to the LDS additive.

The component (C) is preferably an LDS additive with an average particle size (D50) in the range from 50-20000 nanometers, preferably 200 to 15000 nanometers and particularly preferably 300 to 5000 nanometers, and/or an aspect ratio stated at most 10, in particular at most 5. The D50 value stated as a measure of the particle size is a measure of the average particle size, where 50 volume percent of the sample is finer and the other 50% of the sample coarser than the D50 value (median).

In a preferred embodiment, component (C) is an LDS (Laser Direct Structuring) additive selected from the group of the metal oxides, in particular so-called spinels with the general chemical formula $$AB_2O_4$$

wherein A stands for a metal cation with the valency 2, wherein A is preferably selected from the group consisting of: magnesium, copper, cobalt, zinc, tin, iron, manganese and nickel and combinations thereof;
B for a metal cation of valency 3, wherein B is preferably selected from the group consisting of: manganese, nickel, copper, cobalt, tin, titanium, iron, aluminium and chromium and combinations thereof,
wherein particularly preferably the LDS additive is a copper iron spinel, a copper-containing magnesium-aluminium oxide, a copper-chromium-manganese mixed oxide, a copper-manganese-iron mixed oxide, optionally each with oxygen defect sites, or salts and oxides of copper, such as in particular copper(I) oxide, copper(II) oxide, alkaline copper phosphate, copper hydroxide phosphate, copper sulphate, and metal complex compounds, in particular chelate complexes of copper, tin, nickel, cobalt, silver and palladium or mixtures of such systems, and/or in particular selected from the following group: copper-chromium-manganese mixed oxides, copper-manganese-iron mixed oxides, copper-chromium oxide, zinc-iron oxide, cobalt-chromium oxide, cobalt-aluminium oxide, magnesium-aluminium oxide, and mixtures and/or surface-treated forms thereof and/or forms thereof with oxygen deficit sites. Systems such as are for example described in WO-A-2000/35259 or in Plastics 92 (2002) 11, 2-7 are for example possible.

Furthermore, component (C) is preferably selected among phosphates, condensed phosphates, phosphonates, phosphites and mixed hydroxide-phosphate oxo anions of copper (Cu), tin (Sn), and/or iron (Fe), in particular tri-tin phosphate (CAS 15578-32-3), tri-copper phosphate (CAS 7798-23-4), copper diphosphate (CAS 10102-90-6), copper hydroxide phosphate (CAS 12158-74-6) and mixtures thereof.

Also preferably, as component (C), an LDS (Laser Direct Structuring) additive is selected from the group of the metal oxides, metal mixed oxides, metal hydroxide oxides, and metal sulphide oxides based on tin. Particularly preferable is tin oxide and doped tin oxide, wherein the doping can be effected with antimony, bismuth, molybdenum, aluminium, titanium, silicon, iron, copper, silver, palladium and cobalt. Tin oxide which is doped with antimony, titanium or copper is particularly preferable. Furthermore, mixtures of tin oxide and at least one further metal oxide, in particular antimony oxide, are preferable as LDS additives. As further metal oxides here, both colourless highly refractive metal oxides such as in particular titanium dioxide, antimony(III) oxide, zinc oxide, tin oxide and/or zirconium dioxide are used and also coloured metal oxides such as for example chromium oxide, nickel oxide, copper oxide, cobalt oxide and in particular iron oxide (Fe$_2$O$_3$, Fe$_3$O$_4$). Particularly preferably, the mixture of tin oxide and antimony(III) oxide is used.

Preferably the doped tin oxides or metal oxide mixtures or tin oxide are formed as layers on plate-like substrates, in particular layer silicates, such as for example synthetic or natural mica, talc, kaolin, glass plates or silicon dioxide plates. As the substrate for the metal oxides, mica or mica flakes are particularly preferable. Furthermore, plate-like metal oxides such as for example plate-like iron oxide, aluminium oxide, titanium dioxide, silicon dioxide, LCPs (Liquid Crystal Polymers), holographic pigments or coated graphite plates are also possible as substrates.

Particularly preferred are LDS additives based on mica, wherein the mica surface is coated with metal doped tin oxides. Antimony-doped tin oxide is particularly preferred. Examples of commercially available LDS additives according to the present invention are: Lazerflair LS820, LS825, LS830 and Minatec 230 A-IR from Merck, and Stanostat CP40W, Stanostat CP15G or Stanostat CP5C from Keeling & Walker.

Thus LDS additives based on copper and/or tin are preferable as component (C). Preferably, component (C) is selected from the group consisting of tin oxide, metal- or metal oxide-doped tin oxide, antimony-doped tin oxide, metal oxide-coated mica, mica coated with antimony-doped tin oxide, mixture of tin oxide and antimony oxide and optionally further metal oxides, spinels, copper-chromium oxide, copper oxide, copper hydroxide, copper hydroxide phosphate, copper phosphate, alkaline copper phosphate, or mixtures and combinations thereof.

Particularly preferred are the LDS additives (since in combination with the halogen-free flame retardant and the glass fibre reinforcement they result in moulding compounds which have very good mechanical properties) alkaline copper phosphate, copper hydroxide phosphate, copper-tin phosphate, alkaline copper-tin phosphate, tin phosphate, alkaline tin phosphate and antimony-doped tin oxide, wherein the latter is preferably used in combination with mica. By replacement of the LDS additives based on spinels, such as for example copper chromite, by these especially preferable LDS additives, the mechanical properties are markedly improved in otherwise identical moulding compounds. Thus the elongation at break and tear resistance are increased by 10 to 20%, the impact resistance and notch impact resistance by 40% and the HDT A by 10%. The HDT B values of these particularly preferable moulding compounds also lie at least 5° C. higher than the comparable spinel-based moulding compounds.

The moulding compounds according to the invention contain 8 to 18, preferably 9 to 16 and particularly preferably 10 to 15 wt. % of a halogen-free flame retardant (component (D)). Component (D) is preferably constituted of 60-100 wt. %, preferably 70-98 wt. %, particularly preferably 80-96 wt. % of a phosphorus-containing flame retardant, preferably a phosphazene, a phosphinic acid salt and/or diphosphinic acid salt (component D1) and 0-40 wt. %, or 2-30 wt. %, or 4-20 wt. % respectively of a nitrogen-containing synergist and/or of a nitrogen and/or phosphorus-containing flame retardant (component D2), wherein the latter are preferably selected from melamine or condensation products of melamine, such as in particular melem, melam, melon, or reaction products of melamine with polyphosphoric acid or reaction products of condensation products of melamine with polyphosphoric acid or mixtures thereof, in particular melamine polyphosphate.

As component (D2), melamine polyphosphate is particularly preferable. Such flame retardants are known from the state of the art. On this, reference is made to DE 103 46 3261, and the disclosure content of this document regarding this is expressly included herein.

Preferred as component (D1) is a metal salt of phosphinic acid and/or diphosphinic acid and/or polymers thereof, wherein the metal ion is from the $2^{nd}$ or $3^{rd}$ main or transition group of the periodic system and the organic residues are preferably C1-C10 alkyl, linear or branched, and/or aryl, alkylene, arylene, alkylarylene or arylalkylene. As the metal ion, aluminium, calcium, barium and zinc are particularly preferable.

In combination with the flame retardant components (D1) and (D2), 0.5 to 10 wt. %, preferably 0.5 to 5% based on the component (D), of oxygen-, nitrogen- or sulphur-containing metal compounds can optionally be added additionally as so-called "flame retardancy stabilizers" (component (D3)). Preferable metals here are aluminium, calcium, magnesium and zinc. Suitable compounds are selected from the group of the oxides, hydroxides, carbonates, silicates, borates, phosphates, stannates and combinations or mixtures of these compounds, such as for example oxide-hydroxide or oxide-hydroxide-carbonate. Examples are magnesium oxide, calcium oxide, aluminium oxide, zinc oxide, magnesium hydroxide, aluminium hydroxide, bohmite, dihydrotalcite, hydrocalumite, calcium hydroxide, tin oxide hydrate, zinc hydroxide, zinc borate, zinc sulphide, zinc phosphate, zinc carbonate, calcium carbonate, calcium phosphate, magnesium carbonate, alkaline zinc silicate, zinc stannate, calcium stearate, zinc stearate, magnesium stearate, barium stearate, potassium palmitate and magnesium behenate. With the plastic moulding compounds according to the invention and with the moulded articles produced therefrom, it must therefore further be emphasized that, in combination with the excellent properties described above, outstanding fire retardancy is attained. According to the UL classification, the moulding compound is V0 for 0.8 to 3.2 mm thick test pieces (UL-94, Testing according to the Standards of the Underwriters Laboratories (U.L.), see www.ulstandards.com).

The copolyamides according to the invention attain the fire retardant class "V0" even with no addition of synergist (D2). Hence the flame retardancy provision is preferably made up exclusively of the components D1 and D3. Particularly preferred as flame retardant is aluminium diethyl-phosphinate in a concentration range from 11 to 16 wt. % based on the total moulding compound, particularly preferably in combination with 0.2 to 1.0 wt. % melamine polyphosphate, wherein the quantity information in each case relates to the whole moulding compound (sum of A to F).

Preferably, the content of component (E) lies in the range from 0-25 wt. %, preferably in the range from 0-15 wt. % and particularly preferably in the range from 2-15 wt. % or 3-10 wt. %. Talc, chalk or calcium carbonate for example can facilitate the creation of metal seeds or increase the adhesion of the conducting tracks on the substrate.

As particulate fillers of component (E), all fillers known to those skilled in the art are possible. These include in particular particulate fillers selected from the group consisting of talc (magnesium silicate), mica, silicates, quartz, wollastonite, kaolin, silicic acids, magnesium carbonate, magnesium hydroxide, chalk, ground or precipitated calcium carbonate, limestone, feldspar, inorganic pigments such as for example iron oxide or iron-manganese oxide or in particular white pigments such as barium sulphate, zinc oxide, zinc sulphide, lithopone and titanium dioxide (rutile, anatase), permanently magnetic or magnetizable metals or alloys, hollow sphere silicate fillers, aluminium oxide, boron nitride, boron carbide, aluminium nitride, calcium fluoride and mixtures of these. The fillers can also be surface-treated.

As regards component (E), the moulding compounds according to the invention optionally contain 1 to 10, preferably 1 to 8 and particularly preferably 1.5 to 6 wt. % inorganic white pigments based on the total moulding compound. Component (E) can also preferably consist exclusively of the inorganic white pigments, selected from the group barium sulphate, zinc oxide, zinc sulphide, lithopone and titanium dioxide (rutile, anatase), wherein the white pigments preferably have an average particle size (D50) in the range from 0.1-40 µm, preferably in the range from 0.1-20 µm, in particular in the range from 0.1-10 µm. Zinc sulphide is particularly preferable. The metal oxides used as component (E) are different from the components (C) and (D).

The fillers (component E) preferably have an average particle size (D50) in the range from 0.1-40 µm, preferably in the range from 0.2-20 µm, and in particular in the range from 0.3-10 µm. A form of the particulate fillers in which the aspect ratios L/b1 and L/b2 are both at most 10, in particular at most 5, wherein the aspect ratios are described by the quotients of the greatest length L of the particle to its average width b1 or b2 is preferable. Here b1 and b2, which are positioned perpendicular to one another, lie in a plane perpendicular to the length L.

Naturally, as regards component (F), the thermoplastic polyamide moulding compounds according to the invention further contain normal additives generally known to those skilled in the art in the form of the additives (F), which are preferably selected from the group consisting of: coupling agents, stabilizers, antiageing agents, antioxidants, antiozonants, light stabilizers, UV stabilizers, UV absorbers, UV blockers, inorganic heat stabilizers, in particular based on copper halides and alkali metal halides, organic heat stabilizers, conductivity additives, carbon black, optical brighteners, processing aids, nucleating agents, crystallization accelerators, crystallization retardants, flow additives, lubricants, release agents, plasticizers, pigments, in particular organic pigments, dyes different from component (D), marking substances and mixtures of these.

Furthermore, the invention relates to a component (moulded article), in particular component with electrical conducting tracks, based on a moulding compound as described above. Use fields for the MID technology are automobile production, industrial automation, medical technology, the domestic appliance industry, consumer electronics, telecommunications technology, measurement and analytical technology, engineering, and aerospace. Hence the invention also indirectly relates to an article, in particular an interconnect device, containing a moulded article produced from the moulding compound according to the invention. In one embodiment, the interconnect device is used to make an antenna.

Such moulded articles are for example housings or housing parts for wearable electronics, such as for example PDAs, mobile telephones, other telecommunication devices, housings or housing parts for personal computers, notebooks, medical devices, such as for example hearing aids, sensor technology or RFID (Radio Frequency IDentification) transponders or parts for the automobile sector, such as for example airbag module or multifunctional steering wheel.

On the basis of the wide-ranging design possibilities in plastic injection moulding, three-dimensional interconnect devices can be made. In addition, typical mechanical functions such as handles, leads, keys, electric plugs or other connecting components can be integrated. Also possible are connectors for E/E and for fuel systems.

Further embodiments are stated in the dependent claims.

DESCRIPTION OF PREFERRED EMBODIMENTS

The invention will be described below with use of specific practical examples (E) and compared with the less efficient systems according to the state of the art (CE). The practical examples given below serve to substantiate the invention and demonstrate the differences from the state of the art, however, they should not be cited for restriction of the general subject of the invention as defined in the patent claims.

Examples E1 to E14 and Comparative Examples CE1 to CE5

The components stated in Tables 2 to 4 are compounded in a twin extruder from Werner and Pfleiderer with a screw diameter of 25 mm with specified process parameters (Table 1). In this, the polyamide granules and the additives are metered into the feed zone, while the glass fibre is metered into the polymer melt via a side feeder 3 housing units before the nozzle. The granulation was effected by underwater granulation or hot die under water, in which the polymer melt is pressed through a hole-type die and granulated directly after exit from the die by a rotating knife in a water flow. After granulation and drying at 120° C. for 24 hrs, the granule properties were measured and the test pieces produced.

The compounds are injection moulded into test pieces with an injection moulding machine Arburg Allrounder 320-210-750 at defined cylinder temperatures of zones 1 to 4 and a defined tool temperature (see Table 1).

TABLE 1

Compounding and injection moulding for the examples and comparative examples

| Compounding/Processing parameters | | E1-E14, CE1-CE5 |
|---|---|---|
| Compounding | Cylinder temperatures [° C.] | 300-350 |
| | Screw revolution rate [Rpm] | 180 |
| | Throughput [kg/hr] | 8 |
| Injection moulding | Cylinder temperatures [° C.] | 320-340 |
| | Tool temperature [° C.] | 80 |

TABLE 2

Composition and properties of Examples E1 to E7

| | Unit | E1 | E2 | E3 | E4 | E5 | E6 | E7 |
|---|---|---|---|---|---|---|---|---|
| PA 6T/10T (15:85) | Wt. % | 39.85 | 39.85 | 38.0 | 59.85 | 53.0 | 39.85 | 39.85 |
| PA 6T/6I (70:30) | Wt. % | | | | | | | |
| PA 6I/6T (70:30) | Wt. % | 20 | 20 | 10 | | | 20 | 20 |
| Glass fibre type A | Wt. % | 20 | | 30 | 20 | 30 | 20 | 20 |
| Glass fibre type B | Wt. % | | 20 | | | | | |
| LDS additive 1 | Wt. % | 4 | 4 | 4 | 4 | 4 | | |
| LDS additive 2 | Wt. % | | | | | | 4 | |
| LDS additive 3 | Wt. % | | | | | | | 4 |
| FSM-1 | Wt. % | 15 | 15 | 12 | 15 | 12 | 15 | 15 |
| FSM-2 | Wt. % | 0.65 | 0.65 | 0.5 | 0.65 | 0.5 | 0.65 | 0.65 |
| White pigment | Wt. % | | | 5.0 | | | | |
| STAB | Wt. % | 0.5 | 0.5 | 0.5 | 0.5 | 0.5 | 0.5 | 0.5 |
| Tensile E modulus | MPa | 8500 | 8800 | 11200 | 8700 | 11000 | 8600 | 8500 |
| Tear resistance | MPa | 112 | 117 | 120 | 113 | 127 | 130 | 127 |
| Elongation at break | % | 2.0 | 2.2 | 2.0 | 2.1 | 2.1 | 2.3 | 2.3 |
| Impact resistance 23° C. | kJ/m$^2$ | 35 | 44 | 32 | 40 | 35 | 48 | 52 |
| Notch impact resistance 23° C. | kJ/m$^2$ | 5.1 | 7.5 | 5.5 | 6.2 | 5.2 | 7.2 | 7.5 |
| HDT A (1.8 MPa) | ° C. | 205 | 212 | 231 | 245 | 255 | 224 | 225 |
| HDT B (0.45 MPa) | ° C. | 263 | 264 | 275 | >280 | >280 | 269 | 268 |
| Gloss | | 95 | 95 | 90 | 80 | 75 | 94 | 95 |
| Metallizability | | ++ | ++ | ++ | + | + | ++ | ++ |

TABLE 2-continued

Composition and properties of Examples E1 to E7

|  | Unit | E1 | E2 | E3 | E4 | E5 | E6 | E7 |
|---|---|---|---|---|---|---|---|---|
| UL94 |  |  |  |  |  |  |  |  |
| 2 d standard climate |  | V0 | V0 | V0 | V0 | V0 | V0 | V0 |
| 7 d 70° C. |  | V0 | V0 | V0 | V0 | V0 | V0 | V0 |
| Solderability (plate thickness with no blisters) | mm | 1.7 | 1.7 | 1.2 | 1.7 | 1.2 | 1.7 | 1.7 |

TABLE 3

Composition and properties of Comparative Examples CE1 to CE5

|  | Unit | CE1 | CE2 | CE3 | CE4 | CE5 |
|---|---|---|---|---|---|---|
| Composition |  |  |  |  |  |  |
| PA 6T/10T | Wt. % |  | 57 | 67 | 65.5 | 65.5 |
| PA 6I/6T (30:70) | Wt. % | 57 |  |  |  |  |
| PA 6I/6T (70:30) | Wt. % |  |  |  |  |  |
| Glass fibre type A | Wt. % | 30 | 30 | 20 | 30 |  |
| Glass fibre type B | Wt. % |  |  |  |  | 30 |
| LDS additive 1 | Wt. % |  |  |  | 4 | 4 |
| LDS additive 2 | Wt. % |  |  |  |  |  |
| FSM-1 | Wt. % | 12 | 12 | 15 |  |  |
| FSM-2 | Wt. % | 0.5 | 0.5 | 0.5 |  |  |
| STAB | Wt. % | 0.5 | 0.5 | 0.5 | 0.5 | 0.5 |
| Properties |  |  |  |  |  |  |
| Tensile E modulus | MPa | 10800 | 9600 | 8600 | 10800 | 11000 |
| Tear resistance | MPa | 121 | 128 | 113 | 140 | 145 |
| Elongation at break | % | 1.6 | 1.9 | 2.1 | 1.8 | 2.0 |
| Impact resistance 23° C. | kJ/m$^2$ | 43 | 47 | 37 | 32 | 40 |
| Notch impact resistance 23° C. | kJ/m$^2$ | 5.3 | 7.6 | 7.1 | 7.8 | 8.3 |
| HDT A (1.8 MPa) | ° C. | 260 | 258 | 247 | 248 | 249 |
| HDT B (0.45 MPa) | ° C. | >280 | >280 | >280 | >280 | >280 |
| Gloss |  | 70 | 74 | 78 | 76 | 78 |
| Metallizability |  | − | − | − | + | + |
| UL94 |  |  |  |  |  |  |
| 2 d standard climate |  | V0 | V0 | V0 | HB | HB |
| 7 d 70° C. |  | V0 | V0 | V0 | HB | HB |
| Solderability (plate thickness with no blisters) | mm | 1.2 | 1.2 | 1.7 | 1.2 | 1.2 |

TABLE 4

Composition and properties of Examples E8 to E14

|  | Unit | E8 | E9 | E10 | E11 | E12 | E13 | E14 |
|---|---|---|---|---|---|---|---|---|
| PA 6T/10T (15:85) | Wt. % | 49.85 |  | 69.85 | 33 | 33 | 40 | 40 |
| PA 6I/6T (30:70) | Wt. % |  | 49.85 |  |  |  |  |  |
| PA 6I/6T (70:30) | Wt. % | 10 | 10 |  |  |  |  | 20 |
| PPE type A | Wt. % |  |  |  | 20 | 20 | 20 |  |
| Glass fibre type A | Wt. % |  |  |  |  |  | 20 |  |
| Glass fibre type B | Wt. % | 20 | 20 | 10 | 30 | 30 |  |  |
| Glass fibre type C | Wt. % |  |  |  |  |  |  | 20 |
| LDS additive 1 | Wt. % |  |  | 4 |  |  | 4 | 4 |
| LDS additive 2 | Wt. % | 4 | 4 |  | 4 |  |  |  |
| LDS additive 3 | Wt. % |  |  |  |  | 4 |  |  |
| FSM-1 | Wt. % | 15 | 15 | 15 | 12 | 12 | 15 | 15 |
| FSM-2 | Wt. % | 0.65 | 0.65 | 0.65 | 0.5 | 0.5 | 0.5 | 0.5 |
| STAB | Wt. % | 0.5 | 0.5 | 0.5 | 0.5 | 0.5 | 0.5 | 0.5 |
| Tensile E modulus | MPa | 8500 | 8800 | 5700 | 10200 | 10300 | 8500 | 9000 |
| Tear resistance | MPa | 118 | 110 | 98 | 148 | 146 | 108 | 132 |
| Elongation at break | % | 2.3 | 2.0 | 2.7 | 2.3 | 2.4 | 2.0 | 2.3 |

TABLE 4-continued

Composition and properties of Examples E8 to E14

|  | Unit | E8 | E9 | E10 | E11 | E12 | E13 | E14 |
|---|---|---|---|---|---|---|---|---|
| Impact resistance 23° C. | kJ/m$^2$ | 48 | 35 | 33 | 48 | 44 | 35 | 41 |
| Notch impact resistance 23° C. | kJ/m$^2$ | 7.8 | 6.1 | 5.5 | 8.0 | 7.8 | 5.7 | 6.3 |
| HDT A (1.8 MPa) | ° C. | 232 | 234 | 174 | 231 | 230 | 200 | 180 |
| HDT B (0.45 MPa) | ° C. | 273 | 273 | 269 | 270 | 270 | 255 | 257 |
| Gloss 85° |  | 92 | 88 | 82 | 94 | 94 | 90 | 94 |
| Metallizability | — | ++ | ++ | + | ++ | ++ | ++ | ++ |
| UL94 |  |  |  |  |  |  |  |  |
| 2 d standard climate | — | V0 | V0 | V0 | V0 | V0 | V0 | V0 |
| 7 d 70° C. | — | V0 | V0 | V0 | V0 | V0 | V0 | V0 |
| Solderability (plate thickness with no blisters) | mm | 1.7 | 1.7 | 1.7 | 1.2 | 1.2 | 1.2 | 1.7 |

Key, Materials:

PA 6I/6T (70:30) Amorphous, partly aromatic polyamide based on terephthalic acid (30 mol. %), isophthalic acid (70 mol. %) and 1,6-hexanediamine, with a glass transition temperature of 125° C. and a solution viscosity of 1.54.

PA 6I/6T (30:70) Partly crystalline, partly aromatic polyamide based on terephthalic acid (70 mol. %), isophthalic acid (30 mol. %) and 1,6-hexanediamine, with a melting point of 325° C. and a solution viscosity of 1.58.

PA 6T/10T Partly crystalline, partly aromatic polyamide based on 1,6-hexanediamine (15 mol. %), 1,10-decanediamine (85 mol. %) and terephthalic acid, with a melting point of 305° C. and a solution viscosity of 1.62.

PPE type A Bondyram 6008, maleic anhydride-modified PPE, Polyram

Glass fibre type A CPIC ECS 301 HP, 3 mm long, 10 μm diameter, CPIC, China. (Glass fibres with circular cross section)

Glass fibre type B CPIC ECS 301 T, 3 mm long, 24 μm wide, 8 μm thick, aspect ratio of cross-sectional axes=3, CPIC, China (flat glass fibre)

Glass fibre type C: HPXSS PAX95 10-4, 4 mm long, 10 μm diameter, Owens Corning Vetrotex, France, (glass fibres with circular cross section)

LDS additive 1 Shepherd Schwarz 30C965 (The Shepherd Color Company), copper chromite ($CuCr_2O_4$), average particle size of 0.6 μm.

LDS additive 2 Fabulase 322 S, copper(II) hydroxide phosphate, Budenheim

LDS additive 3 Fabulase 330, tin-based metal phosphate, Budenheim

White pigment Titanium dioxide KRONOS 2222, White pigment.>92.5% titanium dioxide. Rutile. Coating: Al, Si, polysiloxane. $d_{50}$ 0.21 μm. D 4.0 g/cm$^3$.

FSM-1 Exolit®OP1230, organophosphorus salt (Clariant Produkte GmbH), flame retardant FSM-2 Melapur 200/70, melamine polyphosphate (BASF)

The measurements were performed in accordance with the following standards and on the following test pieces.

(Thermo-) Mechanical Parameters:

The tensile E modulus was determined according to ISO 527 with a pull speed of 1 mm/min, and the yield stress, tear resistance and elongation at break were determined according to ISO 527 with a pull speed of 50 mm/min (unreinforced variants) or a pull speed of 5 mm/min (reinforced variants) at a temperature of 23° C., wherein as the test piece an ISO pull rod, standard: ISO/CD 3167, Type A1, 170×20/10×4 mm, was used.

Impact resistance and Charpy notch impact resistance were measured according to ISO 179 on the ISO test rod, standard: ISO/CD 3167, Type B1, 80×10×4 mm at temperature 23° C. The thermal behaviour (melting temperature ($T_m$), melting enthalpy ($\Delta H_m$) and glass transition temperature ($T_g$)) were determined on the granules on the basis of the ISO standard 11357-11-2. The differential scanning calorimetry (DSC) was performed with a heating rate of 20° C./min. For the glass transition temperature ($T_g$), the temperature for the middle stage and the inflection point is stated.

The relative viscosity ($\eta_{rel}$) was measured at 20° C. according to DIN EN ISO 307 on the basis of 0.5 wt. % m-cresol solutions. Granules were used as the sample.

The thermal distortion resistance in the form of HDT A (1.8 MPa) and HDT B (0.45 MPa) were determined according to ISO 75 on ISO batons of dimensions 80×10×4 mm.

Surface Properties, Gloss:

The gloss was determined according to ISO 2813 on plates of dimensions 80×80×1 mm with an instrument of the Minolta Multi Gloss 268 type at an angle of 85° and at a temperature of 23° C.

Laser Structurability:

For the assessment of the metallization behaviour, injection moulded articles (plate 60×60×2 mm) were structured by means of an Nd:YAG laser and then metallized currentless in the copper plating bath. In the laser structuring, 18 adjacent 5×7 mm sized areas on the moulded article surface were irradiated. The laser structuring was effected by means of an LPKF Microline 3D laser at a wavelength of 1064 nm and an irradiation width of about 50 μm at a speed of 4 m/s. During this, both the pulse frequency and also the output of the laser were varied. For the specific pulse frequencies of 60, 80 and 100 kHz, the output was in each case varied in the range from 3-17 watts. Following the laser structuring, the moulded articles are subjected to a cleaning process to remove the residues of the laser process. During this, the moulded articles pass successively through ultrasound baths with surfactant and deionized water. The cleaned moulded articles are then metallized in a reducing copper plating bath (MacDermid MID-Copper 100 B1) for 60-80 minutes. During this, copper is deposited in an average thickness of 3 to 5 μm on the areas irradiated by the laser.

Metallizability:

The metallizability was assessed optically as follows:

++: all 18 fields were each uniformly metallized and the deposited copper layer has an average thickness of 3 to 5 μm.

+: 15-17 fields were each uniformly metallized and the deposited copper layer has an average thickness of 3 to 5 μm (fields structured at minimal energy are inadequately metallized).

o: 12-14 fields were each uniformly metallized and the deposited copper layer has an average thickness of 3 to 5 μm.

−: Fewer than 12 fields were each uniformly metallized and the deposited copper layer has an average thickness of 3 to 5 μm or unstructured regions (without irradiation) were metallized.

Chemical reductive copper deposition is the decisive initial metallization process in all moulded interconnect device (MID) technologies, which determines the quality of the whole layer. Hence it is entirely sufficient to assess the quality of the primary metal layer.

In order to arrive at the finished MID component, as a rule nickel and then a final layer of immersion gold are deposited, building on the first copper layer (primary layer). Of course, other metal layers, such as for example further copper, palladium, tin or silver layers can be applied onto the primary layer.

Solderability:

Staged plates of the following dimensions are produced in the injection moulding process: length×width 60×60 and during this the plate height is implemented in 5 step-like stages as follows: 1.2 mm, 1.7 mm, 2.2 mm, 2.7 mm and 3.2 mm. Also, the step stages are 60 mm wide and 12 mm deep. These staged plates are conditioned at 85° C. and 85% relative humidity for 168 hours in a climatic cabinet Allen 600 from Angelantoni Industrie s.p.a. (IT) as described in the Joint Industry Standard IPC/JEDEC J-STD-020D.1 for the Moisture Sensitivity Level (MSL 1). Then in each case 3 staged plates are laid on a circuit board (one-sided temperature loading) and transported at a conveyor belt speed of 200 mm/min through a Reflow soldering system RO300FC from Essemtec AG (CH). The hot zones are set to the temperatures stated in Table 5. In test 2 (one-sided), for the 1.7 mm-thick plate stage the specified soldering profile results in a peak temperature of 260° C. The surface temperature in the stage with 1.7 mm thickness is 54 secs over 255° C. and 22 secs over 260° C. As the result of the solder test, the thickness of the test plate stage with no blisters was determined as the minimum wall thickness and entered in Tables 2 to 4. CE1 to CE3 have adequate mechanical properties, attain the flame retardant classification V0 and are solderable in the reflow process, however, they are not metallizable. On the other hand, CE4 and CE5 can be satisfactorily metallized, but do not meet the fire retardancy requirement according to UL94.

On the other hand, moulded parts produced from the moulding compounds of Examples E1 to E14 have good mechanical properties and high surface quality (gloss), are reliably solderable in the reflow process and attain the fire retardant classification V0 according to UL94.

The invention claimed is:

1. A thermoplastic moulding compound consisting of:
   (A) 21-81.9 wt. % polyamide, consisting of 65-95 wt. % partly aromatic, partly crystalline polyamide, selected from the group consisting of 10T/6T, 6T/6I and mixtures thereof and 5-35 wt % amorphous, partly aromatic polyamide consisting of 6I/6T;
   (B) 10-70 wt. % glass fibres;
   (C) 0.1-10 wt. % LDS additive or a mixture of LDS additives;
   (D) 8-18 wt. % halogen-free flame retardant;
   (E) 0-40 wt. % particulate filler, different from (C); and
   (F) 0-2 wt. % other further additives,
   wherein the sum of (A)-(F) makes up 100 wt. %.

2. The thermoplastic moulding compound according to claim 1, wherein the content of component (A) lies in the range from 25-75.5 wt. %, based on the sum of (A)-(F).

3. The thermoplastic moulding compound according to claim 1, wherein the content of component (B) lies in the range from 15-60 wt. %, based on the sum of (A)-(F).

4. The thermoplastic moulding compound according to claim 1, wherein the glass fibres of component (B) are selected as E-glass fibres according to ASTM D578-00, or are selected as high-strength glass fibres based on the ternary system silicon dioxide-aluminium oxide-magnesium oxide or on the quaternary system silicon dioxide-aluminium oxide-magnesium oxide-calcium oxide.

5. The thermoplastic moulding compound according to claim 1, wherein the glass fibres of component (B) are glass fibres with non-circular cross section, wherein the dimension ratio of the major cross-sectional axis to the minor cross-sectional axis lying perpendicular thereto is more than 2.5.

6. The thermoplastic moulding compound according to claim 1, wherein the content of component (C) lies in the range from 0.5-8 wt. % based on the sum of (A)-(F).

7. The thermoplastic moulding compound according to claim 1, wherein component (C) contains at least one LDS additive or is entirely formed by an LDS additive selected from the following group: metal oxide, metal phosphate.

8. The thermoplastic moulding compound according to claim 1, wherein the content of component (D) lies in the range from 11-17 wt. % based on the sum of (A)-(F).

9. The thermoplastic moulding compound according to claim 1, wherein the halogen-free flame retardant (D) is a phosphorus-based flame retardant.

10. The thermoplastic moulding compound according to claim 1, wherein component (D) consists of:
    (D1) 60-100 wt. % of one or more of at least one of: phosphinic acid salts, diphosphinic acid salts, wherein a metal ion thereof is independently selected from the group consisting of:
    aluminium, calcium, barium, zinc or combinations thereof;
    (D2) 0-30 wt. % of a at least one of: nitrogen-containing synergist, nitrogen-containing flame retardant; and
    (D3) 0-10 wt. % flame retardancy stabilizers,
    wherein (D1), (D2) and (D3) add up to 100 wt. % component (D).

11. The thermoplastic moulding compound according to claim 1, wherein the content of component (E) lies in the range from 0-25 wt. %, based on the sum of (A)-(F).

12. A component comprising the thermoplastic moulding compound according to claim 1.

13. The thermoplastic moulding compound according to claim 1, wherein the partly crystalline, partly aromatic polyamide of component (A) has a melting enthalpy determined by DSC (ISO Standard 11357-11-2) in the range from 25 to 80 J/g.

14. The thermoplastic moulding compound according to claim 1, wherein the partly crystalline, partly aromatic polyamide of component (A) has a melting enthalpy determined by DSC (ISO Standard 11357-11-2) in the range from 30 to 70 J/g.

15. The thermoplastic moulding compound according to claim 1, wherein the content of component (A) lies in the range from 30-71 wt. %, based on the sum of (A)-(F).

16. The thermoplastic moulding compound according to claim 1, wherein the content of component (B) lies in the range from 20-45 wt. %, based on the sum of (A)-(F).

17. The thermoplastic moulding compound according to claim 1, wherein the glass fibres of component (B) are selected as E-glass fibres according to ASTM D578-00, with non-circular cross section,
or are selected as high-strength glass fibres, with non-circular cross section, based on the ternary system silicon dioxide-aluminium oxide-magnesium oxide or on the quaternary system silicon dioxide-aluminium oxide-magnesium oxide-calcium oxide.

18. The thermoplastic moulding compound according to claim 1, wherein the glass fibres of component (B) are selected as E-glass fibres according to ASTM D578-00, of 52-62% silicon dioxide, 12-16% aluminium oxide, 16-25% calcium oxide, 0-10% borax, 0-5% magnesium oxide, 0-2% alkali metal oxides, 0-1.5% titanium dioxide and 0-0.3% iron oxide,
or are selected as high-strength glass fibres, based on the ternary system silicon dioxide-aluminium oxide-magnesium oxide or on the quaternary system silicon dioxide-aluminium oxide-magnesium oxide-calcium oxide, wherein they have the following composition: 58-70 wt. % silicon dioxide ($SiO_2$), 15-30 wt. % aluminium oxide ($Al_2O_3$), 5-15 wt. % magnesium oxide (MgO), 0-10 wt. % calcium oxide (CaO) and 0-2 wt. % further oxides, including zirconium dioxide ($ZrO_2$), boron oxide ($B_2O_3$), titanium dioxide ($TiO_2$) or lithium oxide ($Li_2O$) or a combination of these oxides.

19. The thermoplastic moulding compound according to claim 1, wherein the glass fibres of component (B) are glass fibres with non-circular cross section, wherein the dimension ratio of the major cross-sectional axis to the minor cross-sectional axis lying perpendicular thereto lies in the range from 3 to 5.

20. The thermoplastic moulding compound according to claim 1, wherein the content of component (C) lies in the range from 1-6 wt. %, based on the sum of (A)-(F).

21. The thermoplastic moulding compound according to claim 1, wherein component (C) contains at least one LDS additive or is entirely formed by an LDS additive selected from the following group: metal oxide, alkaline metal phosphate, metal hydroxide phosphate, or a mixture thereof.

22. The thermoplastic moulding compound according to claim 1, wherein component (C) contains at least one LDS additive or is entirely formed by an LDS additive which is an inorganic compound based on copper and/or tin.

23. The thermoplastic moulding compound according to claim 1, wherein component (C) contains at least one LDS additive or is entirely formed by an LDS additive selected from the following group: tin oxide; metal- or metal oxide-doped tin oxide; antimony-doped tin oxide; metal oxide-coated mica; mica coated with antimony-doped tin oxide; mixture of tin oxide and antimony oxide with or without further metal oxides; spinels; copper-chromium oxide; copper oxide; copper hydroxide; copper hydroxide phosphate; copper phosphate; alkaline copper phosphate; copper-tin phosphate; alkaline copper-tin phosphate; tin phosphate; alkaline tin phosphate; antimony-doped tin oxide, in combination with or not in combination with mica; or mixtures and combinations thereof.

24. The thermoplastic moulding compound according to claim 1, wherein the content of component (D) lies in the range from 13-16 wt. %, based on the sum of (A)-(F).

25. The thermoplastic moulding compound according to claim 1, wherein the halogen-free flame retardant (D) is a phosphorus-based flame retardant, and wherein it contains at least one species selected from a reaction product of melamine with phosphoric acid, (di)phosphinate salt and a phosphazene compound.

26. The thermoplastic moulding compound according to claim 1, wherein component (D) consists of:
(D1) 60-100 wt. % of one or more of at least one of: phosphinic acid salts, diphosphinic acid salts, wherein the metal ion is independently selected from the group consisting of: aluminium, calcium, barium, zinc or combinations thereof;
(D2) 0-30 wt. % of at least one of: a nitrogen-containing synergist, a nitrogen-containing flame retardant, a phosphorus-containing flame retardant, elected from the group consisting of melamine or condensation products of melamine, or mixtures thereof; and
(D3) 0-10 wt. % flame retardancy stabilizers, including zinc borate or barium stearate, wherein (D1), (D2) and (D3) add up to 100 wt. % component (D).

27. The thermoplastic moulding compound according to claim 1, wherein the content of component (E) lies in the range from 3-10 wt. %, based on the sum of (A)-(F).

28. A component with electrical conducting tracks, comprising the thermoplastic moulding compound according to claim 1, wherein the component is a housing or housing part for wearable electronic devices, PDAs, mobile telephones, telecommunication devices, personal computers, notebooks, medical devices, hearing aids, sensor technology, RFID transponders, parts for the automobile sector, airbag modules, or multifunction steering wheel.

29. The thermoplastic moulding compound according to claim 1, wherein component (D) consists of:
(D1) 60-100 wt. % of one or more of at least one of: phosphinic acid salts, diphosphinic acid salts, wherein the metal ion is independently selected from the group consisting of: aluminium, calcium, barium, zinc or combinations thereof;
(D2) 0-30 wt. % of at least one of: a nitrogen-containing synergist, a nitrogen-containing flame retardant, a phosphorus-containing flame retardant, elected from the group consisting of melamine or condensation products of melamine, selected from the group consisting of melem, melam, melon, or reaction products of melamine with polyphosphoric acid or reaction products of condensation products of melamine with polyphosphoric acid or mixtures thereof; and
(D3) 0-10 wt. % flame retardancy stabilizers, including zinc borate or barium stearate, wherein (D1), (D2) and (D3) add up to 100 wt. % component (D).

30. A thermoplastic moulding compound consisting of:
(A) 21-81.9 wt. % thermoplastic material, consisting of
(A1) 55-85 wt. % polyamide, containing at least 50 wt. % partly aromatic, partly crystalline polyamide selected from the group consisting of 10T/6T, 6T/6I and mixtures thereof; and
(A2) 15-45 wt. % of at least one maleic anhydride-modified polyphenylene ether,
wherein (A1) and (A2) add up to 100 wt. % component (A),
(B) 10-70 wt. % glass fibres;
(C) 0.1-10 wt. % LDS additive or a mixture of LDS additives;

(D) 8-18 wt. % halogen-free flame retardant;
(E) 0-40 wt. % particulate filler, different from (C); and
(F) 0-2 wt. % other further additives,
wherein the sum of (A)-(F) makes up 100 wt. %.

* * * * *